United States Patent
Kaestli et al.

(10) Patent No.: US 11,297,401 B2
(45) Date of Patent: Apr. 5, 2022

(54) METHOD FOR TESTING A PLURALITY OF NOTIFICATION APPLIANCES CONNECTED TO A BUS SYSTEM AND NOTIFICATION APPLIANCE FOR CONDUCTING THE TEST

(71) Applicant: Siemens Schweiz AG, Zürich (CH)

(72) Inventors: Urs Kaestli, Männedorf (CH); Marc Wenzler, Horgen (CH); Peter Philip Hofer, Horgen (CH); Peter Baertschi, Steinhausen (CH); Xue Song Shen, Beijing (CN)

(73) Assignee: SIEMENS SCHWEIZ AG, Zurich (CH)

( * ) Notice: Subject to any disclaimer, the term of this patent is extended or adjusted under 35 U.S.C. 154(b) by 0 days.

(21) Appl. No.: 16/888,950

(22) Filed: Jun. 1, 2020

(65) Prior Publication Data
US 2020/0382851 A1    Dec. 3, 2020

(30) Foreign Application Priority Data
Jun. 3, 2019 (EP) .................................. 19177938

(51) Int. Cl.
*H04Q 9/00* (2006.01)
*G01R 22/06* (2006.01)
*H04L 12/40* (2006.01)

(52) U.S. Cl.
CPC ............ *H04Q 9/00* (2013.01); *G01R 22/068* (2013.01); *H04L 12/40* (2013.01); *H04Q 2209/823* (2013.01); *H04Q 2209/84* (2013.01)

(58) Field of Classification Search
CPC .. H04Q 9/00; H04Q 2209/10; H04Q 2209/30; H04Q 2209/823; H04Q 2209/84; G01R 22/068; H04L 12/40
See application file for complete search history.

(56) References Cited

U.S. PATENT DOCUMENTS

| | | | |
|---|---|---|---|
| 8,723,672 B2 * | 5/2014 | Johnson ................... | G08B 3/10 340/540 |
| 9,607,494 B2 * | 3/2017 | Pattok ..................... | G08B 17/10 |
| 2018/0300279 A1 | 10/2018 | Kästli ................. | G06F 13/4068 |

FOREIGN PATENT DOCUMENTS

| | | | |
|---|---|---|---|
| EP | 2 393 073 | 12/2011 | ............. G08B 29/12 |
| EP | 3 154 220 | 4/2017 | ............. H04L 12/10 |
| WO | 2011 117168 | 9/2011 | ............. G01R 31/02 |

OTHER PUBLICATIONS

Search Report for EP Application No. 19177938.8, 5 pages, dated Nov. 29, 2019.

* cited by examiner

*Primary Examiner* — Franklin D Balseca
(74) *Attorney, Agent, or Firm* — Slayden Grubert Beard PLLC (57) ABSTRACT

Various embodiments include a method for operating a hazard notification system including a plurality of notification appliances connected to a bus system, each notification appliance having a signal element and an activatable energy consumption simulation unit comprising: receiving a switchover telegram at each notification appliance; attaching the respective energy consumption simulation unit of each notification appliance to the bus system in place of the signal element; measuring an energy consumption resulting in the bus system due to the activation of each energy consumption simulation unit in the course of a load test; comparing the measured energy consumption with predefined comparison values; and generating an alarm signal or a fault message as a function of the result of the comparison.

11 Claims, 3 Drawing Sheets

METHOD FOR TESTING A PLURALITY OF NOTIFICATION APPLIANCES CONNECTED TO A BUS SYSTEM AND NOTIFICATION APPLIANCE FOR CONDUCTING THE TEST

CROSS-REFERENCE TO RELATED APPLICATIONS

This application claims priority to EP Application No. 19177938.8 filed Jun. 3, 2019, the contents of which are hereby incorporated by reference in their entirety.

TECHNICAL FIELD

The present disclosure relates to hazard notification systems. Various embodiments may include methods for operating a plurality of notification appliances connected to a bus system of a hazard notification system installed in a building, e.g., a method for testing the notification appliances and the bus system during operation, notification appliances intended for use within the scope of the test, and/or hazard notification systems comprising a plurality of such notification appliances which are connected to a bus system disposed therein.

BACKGROUND

Notification appliances here and in the following are such notification appliances that are connectable to a bus system and during operation are connected to a bus system, and which output a signal, for example an optical and/or acoustic signal, that is intended for the users of a building. A notification appliance in this sense is for example a strobe light, a siren and the like.

In the building automation field, more and more bus systems, for example field buses, are deployed to connect sensors and actuators provided therein on account of the resulting flexibility. To ensure reliable operation of a hazard notification system comprising a plurality of notification appliances connected to the bus system, it is essential that the bus system be capable of functioning for example even in the case of what may be termed a minor fault (wire break or short-circuit), that the electrically conducting connection of each notification appliance to the bus system is properly implemented and properly maintained, and also that an energy consumption or energy requirement of each individual notification appliance remains within predefined limits, in particular that an operating voltage of each notification appliance remains within predefined limits.

In a bus system, it is necessary that the bus lines thereof possess the required electrical properties and that all the bus lines along the entire spatial reach of the bus system are conductive and also possess uniform electrical properties. Faults in a bus system may result due to a broken cable, for example. In a properly implemented connection of a notification appliance to a bus system, screwed connections or the like or soldered connections are implemented in such a way that a connection having permanently consistent electrical properties is guaranteed. In the case of a connection of a notification appliance that was originally completed properly in compliance with the applicable regulations, corrosion or other environmental influences may lead to a situation where after a certain time the connection no longer functions properly. A notification appliance exhibiting a short-circuit or some other internal malfunction may be connected correctly, but leads to an increase in energy consumption on the bus system due for example to a short-circuit current resulting from a short-circuit.

In the prior art, a test of a hazard notification system comprising a plurality of notification appliances connected to a bus system was carried out by activating the notification appliances connected to the bus system as though in an alarm situation. During the test, a notification appliance of such a hazard notification system therefore emits for example acoustic and/or optical signals which normally draw attention to an alarm situation. Such a test is therefore not possible in normal circumstances in a building when the building is occupied by users.

A common method for monitoring properly implemented and properly functioning connections of all the notification appliances connected to a bus system is to monitor the overall resistance of the bus system (line resistance) and is described for example in U.S. Pat. No. 8,405,400. Special cases where stubs are used are known for example from WO 2011/117168 A1, from EP 2 105 898 A1 and from WO 2013/089932 A1.

A method for testing a notification appliance is described in U.S. Pat. No. 7,333,010. There, the method specifically concerns a test at low voltages, for example due to a reducing battery charge. A feed voltage delivered to the bus system, a measurement value recorded in relation to a notification appliance and/or an impedance determined in relation to the notification appliance are used in order to make a declaration concerning the operational readiness of the notification appliance at the feed voltage delivered in each case.

In the methods known from the cited prior art, the respective signal elements of the notification appliances are activated during the test in each case. The tests therefore cannot be performed at any random time and automatic continuous monitoring is likewise not possible.

SUMMARY

The teachings of the present disclosure include test methods that can be carried out at any time and optionally may also be performed automatically at regular intervals whilst no activation of the signal elements of the notification appliances takes place. For example, some embodiments include a method for operating a hazard notification system (10) comprising a plurality of notification appliances (12) connected to a bus system (14), each having at least one signal element (22), wherein each notification appliance (12) comprises an activatable energy consumption simulation unit (20), wherein, in response to receiving a switchover telegram (40), each notification appliance (12) attaches its energy consumption simulation unit (20) to the bus system (14) in place of the or each signal element (22) incorporated in the respective notification appliance (12), wherein an energy consumption resulting in the bus system (14) and/or specifically in each notification appliance (12) due to the activation of each energy consumption simulation unit (20) is measured in the course of a load test and compared with predefined or predefinable comparison values, and wherein an alarm signal and/or a fault message are/is generated as a function of the result of the comparison.

In some embodiments, a central unit (16) acting as a master unit on the bus system (14) measures an energy consumption resulting in the bus system due to the activation of the or each energy consumption simulation unit (20) during the load test and compares said measured energy consumption with a predefined or predefinable threshold value, and wherein the central unit (16) generates the alarm signal and/or the fault message as a function of the result of the comparison.

In some embodiments, during the load test and following the activation of its energy consumption simulation unit (20), each notification appliance (12) captures measurement values relating to a voltage dropping across the energy consumption simulation unit (20) and stores a minimum value, and wherein following the load test, a central unit (16) acting as a master unit on the bus system (14) polls each notification appliance (12) for the minimum value stored therein and compares said value with a predefined or predefinable threshold value, and wherein the central unit (16) generates the alarm signal and/or the fault message as a function of the result of the comparison.

In some embodiments, the central unit (16) conducts the load test in multiple stages and at each new stage reduces a feed voltage delivered to the bus system (14).

In some embodiments, the central unit (16) switches over a feed direction of the bus system (14) during the load test and wherein the load test is performed with a first feed direction prior to the switchover and with a second feed direction opposite to the first feed direction after the switchover.

In some embodiments, the central unit (16) performs the load test automatically at predefined or predefinable times.

In some embodiments, the central unit (16) automatically performs the load test when the number of notification appliances (12) connected to the bus system (14) changes.

As another example, some embodiments include a notification appliance (12) for connecting to a bus system (14) and for use in a hazard notification system (10) comprising a plurality of notification appliances (12) connected to a bus system (14), wherein the notification appliance (12) comprises at least one signal element (22) as well as an activatable energy consumption simulation unit (20), wherein, in response to receiving a switchover telegram (40), the energy consumption simulation unit (20) can be automatically attached to the bus system (14) in place of the or each signal element (22).

As another example, some embodiments include a hazard notification system (10) comprising a bus system (14) and a plurality of notification appliances (12) connected to the bus system (14) as claimed in claim 8 and a central unit (16) acting as a master unit on the bus system (14), wherein a switchover telegram (40) can be output onto the bus system (14) by means of the central unit (16), wherein, in response to receiving the switchover telegram (40), each notification appliance (12) connected to the bus system (14) attaches its energy consumption simulation unit (20) to the bus system (14) in place of the or each signal element (22) incorporated in the respective notification appliance (12), and wherein the central unit (16) initiates and monitors the performance of a method as claimed in one of the preceding claims.

In some embodiments, a direction in which a current is fed into the bus system (14) can be switched over by means of the central unit (16) and is switched over during the load test.

In some embodiments, during a multistage load test performed by means of the central unit (16), a feed voltage delivered to the bus system (14) can be reduced at each new stage of the load test and is reduced during the load test.

BRIEF DESCRIPTION OF THE DRAWINGS

An exemplary embodiment of the teachings herein is explained in more detail below with reference to the drawings. Objects or elements that are equivalent to one another are designated by the same reference signs in all the figures. In the figures.

DETAILED DESCRIPTION

In some embodiments, each notification appliance comprises an activatable energy consumption simulation unit in addition to at least one signal element in each case. The energy consumption simulation unit is sometimes referred to in the following as a simulation unit for short. During the test, the simulation unit in a notification appliance is attached to the bus system in place of the at least one signal element. The at least one signal element is then inactive and no optical or acoustic signals that would otherwise be output by means of the respective signal element are output during the test. Instead, the simulation unit is switched for attachment to the bus system. The simulation unit is an electrical load on the bus system and takes the place of the at least one signal element of the respective notification appliance.

At least in terms of its energy consumption in the bus system, the simulation unit has the same or at least substantially the same properties as the at least one electrical load, which it replaces in the state attached to the bus system, i.e. in particular the same or at least substantially the same dependence of the terminal voltage on the current intensity, the same or at least substantially the same resistance, the same or at least substantially the same impedance, the same or at least substantially the same capacitance, and/or the same or at least substantially the same inductance. When reference is made in the following to the electrical properties of the simulation unit to the effect that the latter has the same or at least substantially the same properties in the aforementioned sense, this is often written for concision only as the same property or the same properties. In such cases it should always be taken as implied that it is not necessarily a question of exactly the same property or exactly the same properties, but rather of the same or at least substantially the same property or the same or at least substantially the same properties. A variation in the region of up to 5% or up to 10% counts in this sense as "at least substantially the same property".

In some embodiments, a method for testing (load testing) a hazard notification system comprising a plurality of notification appliances connected to a bus system, wherein each notification appliance comprises an activatable energy consumption simulation unit (simulation unit) and wherein the test can be or is carried out during the operation of the hazard notification system, comprises at least the following steps: Each notification appliance connected to the bus system activates its simulation unit in response to receiving a switchover telegram acting as an energy consumption simulation signal. The activation of the simulation unit means that the respective notification appliance attaches its simulation unit to the bus system in place of the or each signal element incorporated in the notification appliance. Within the scope of the load test, an energy consumption resulting in the bus system and/or specifically in each notification appliance due to the activation of each simulation unit is then measured and compared with predefined or predefinable comparison values. Depending on the result of the comparison, an alarm signal and/or a fault message are/is generated. Because an activation of optical or acoustic signal elements is reliably avoided during the test (load test), the test may also be referred to as a "silent test".

If too high a feed current delivered to the bus system flows during the test, this equates to an excessively high energy consumption in the bus system and an alarm signal and/or a fault message are/is generated automatically. If too high a current flows into an activated simulation unit during the test, this equates to an excessively high energy consumption in the bus system that is detected specifically in relation to an individual notification appliance and an alarm signal and/or a fault message are/is generated automatically.

In some embodiments, the notification appliances include such an activated simulation unit. In some embodiments, there is a notification appliance, i.e. for example a fire alarm or the like, for connection to a bus system and for use in a hazard notification system comprising a plurality of notification appliances connected to a bus system, as well as for use in a method of the type described here and in the following. The notification appliance is characterized in that it comprises an activatable energy consumption simulation unit (simulation unit) in addition to at least one signal element and that, in response to receiving a switchover telegram, the simulation unit can be attached to the bus system automatically in place of the or each signal element by the notification appliance and is attached to the bus system.

In order to avoid unnecessary repetitions, it holds for the further description that features and details that are described in connection with the test method proposed here, as well as possible embodiments, of course apply also to notification appliances configured to perform the method, and vice versa. Accordingly, the method may also be developed by means of individual or multiple method features that relate to method steps performed by one notification appliance or by a plurality of notification appliances. Similarly, the or each notification appliance may also be developed by means for performing method steps carried out within the scope of the method. Each time object-related features of a notification appliance are mentioned, their use within the context of the method is always to be understood implicitly as well, as are method steps or method step sequences following on therefrom. Equally, whenever method steps or method step sequences are explained, the means necessary for performing the same that are provided by a notification appliance, the bus system or a central unit of the bus system are always to be understood implicitly as well.

In some embodiments, the load test can be performed without simultaneously activating optical or acoustic signal elements, and consequently the load test can be carried out in a building even when the building is occupied by users. The various embodiments described herein are not to be understood as an abandonment of the achievement of an independent, objective protection for the features or feature combinations. Furthermore, with regard to interpretation of the description in the case of a more detailed concrete realization of a feature, it is to be assumed that a limitation of said type is not present in a more general embodiment variant of the objective test method or device. Any reference in the description to aspects of various embodiments is accordingly to be read explicitly as a description of optional features even in the absence of a specific reference.

In some embodiments, a central unit acting as a higher-ranking master unit on the bus system measures an energy consumption in the bus system resulting due to the activation of the or each simulation unit during the load test, compares a characteristic value relating to the energy consumption, for example a current measurement value, with a predefined or predefinable threshold value and, depending on the result of the comparison, generates the alarm signal and/or the fault message. With this variant of the load test, the energy consumption in the bus system as a whole is considered.

In some embodiments, during the load test and following the activation of its simulation unit, each notification appliance captures measurement values relating to a voltage dropping across the simulation unit and stores a minimum value resulting during the load test. Following the load test, the central unit acting as a master unit on the bus system polls each notification appliance for the minimum value stored therein and compares said minimum value with a predefined or predefinable threshold value, in particular a predefined or predefinable threshold value specific to a notification appliance or to a type of notification appliance. Depending on the result of the comparison, the central unit once again generates the alarm signal and/or the fault message. With this variant of the load test, the energy consumption of each individual notification appliance connected to the bus system is considered.

Both of the above-cited variants (consideration of the energy consumption in the bus system as a whole; consideration of the energy consumption of each individual notification appliance) may be used individually or in combination within the scope of the test method.

In some embodiments, the central unit conducts the load test in multiple stages and at each new stage reduces a feed voltage delivered to the bus system. In this case the feed voltage is reduced for example by a predefined or predefinable increment starting from a predefined or predefinable start value and moving in the direction of a predefined or predefinable target value. These embodiments may be used for notification appliances whose energy consumption is dependent on a voltage supplied to the notification appliance in each case via the bus system, as in the case for example of notification appliances having a signal element with constant resistance. By being successively reduced in the course of the load test, the feed voltage approaches the lowest possible operating voltage for the respective notification appliance. In this way, the maximum current at which the bus system can still be operated can be determined, for example, and/or the system reserve (operating reserve of the bus system) can be calculated, for example in relation to additional notification appliances, voltage fluctuations in the control center and/or changes in the line resistance (dependent on temperature or due to corrosion, for example). Determining the system reserve also enables options for further network expansion to be estimated, i.e. in particular for the connection of further notification appliances to the bus system.

In some embodiments, the central unit switches over a feed direction of the bus system—a direction in which a current is fed into the bus system—during the load test and the load test begins prior to such a switchover with a first feed direction and after the switchover is continued with a second feed direction opposite to the first feed direction and terminated. Such a switchover of feed direction is advantageous because it enables account to be taken of the fact that the resistance distribution, i.e. the distribution of the resistances of connected notification appliances, is not required to be symmetric on the bus system. With different feed directions and with an asymmetric resistance distribution, different voltage drops are therefore produced along the bus lines and the conditions in both directions can be tested by means of the switchover. Thus, for example, the lowest possible feed voltage at which all notification appliances can still be operated can be determined in both directions. Furthermore, such a switchover is advantageous because it also enables account to be taken of the fact that an operational reliability of the bus system must be guaranteed at least in the case of a minor fault and therefore an automatic switchover of the feed direction can be performed in order to overcome such a minor fault. In a load test involving a switchover of the feed direction, the operational reliability of the bus system can be tested for both possible feed directions and consequently also the operational reliability for the feed direction resulting in the case of a fault.

In some embodiments, the test method (the load test) is repeated automatically at regular intervals, in particular cyclically, in that the central unit performs the load test automatically at predefined or predefinable times. Performing the test at regular intervals also helps in detecting creeping changes. An intervention can then be made at an early stage and the full functionality of the system (hazard notification system) is maintained. Furthermore, the regular testing can be logged and the logs can be kept available for documentation purposes.

In some embodiments, the test method (the load test) is performed automatically by the central unit when the number of notification appliances on the bus system changes, i.e. when a new notification appliance is connected to the bus system, for example. In this case, too, performing the test automatically helps in testing and documenting the operational reliability of the system (hazard notification system). Theoretically, whenever a change to the system takes place, i.e. one notification appliance is swapped out and replaced by a new notification appliance, a notification appliance is removed or an additional notification appliance is connected to the bus system, conditions can be produced in which a reliable operation of the system is no longer guaranteed. A test performed automatically close in time following a change to the system ensures that potential problems during the operation of the modified system are detected at an early stage and timely preemptive action can be taken.

The exemplary embodiments do not limit the scope of the teachings herein. Rather, additions and modifications are also entirely possible within the scope of the present disclosure, in particular such that may be derived on the part of the person skilled in the art with regard to the achievement of the object, for example through combination or variation of individual features or method steps described in connection with those in the general or specific description part and contained in the claims and/or drawings and that lead by means of combinable features to a new subject matter or to new method steps or method step sequences.

Figure 1:
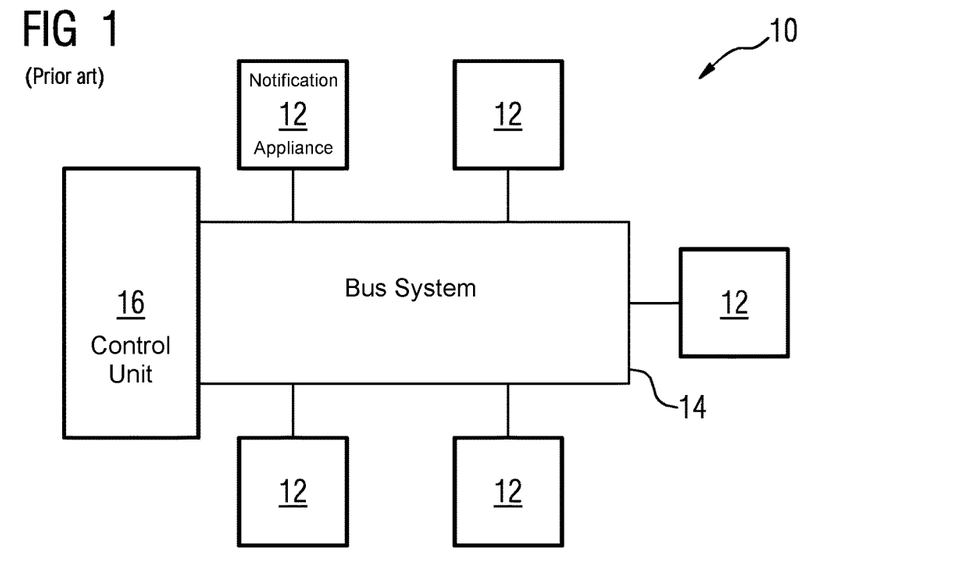
FIG. 1 shows a hazard notification system comprising a plurality of notification appliances connected to a bus system.

The schematic diagram in FIG. 1 shows a hazard notification system 10 comprising a plurality of devices designated below collectively as notification appliances 12 for short. The notification appliances 12 are connected in a manner generally known per se to a bus system 14 (bus nodes). The bus system 14 starts from a central unit 16 acting as bus master connected to the bus system 14. By means of the bus system 14, the notification appliances 12 are connected for communication purposes, in a manner generally known per se, at least to the central unit 16 and/or to other notification appliances 12 connected to the bus system 14.

The bus system 14 is for example a bus system 14 known by the acronym FDnet (Field Device Network) or Cnet or a comparable bus system 14. A notification appliance 12 is for example a strobe light, a siren, a voice sounder or the like. Such notification appliances 12 are known per se in relation to their respective alarm-triggering functionality as well as in relation to their connection to a respective bus system 14, so that no further description will be given here in this respect and reference will be made instead to the prior art.

Figure 2:
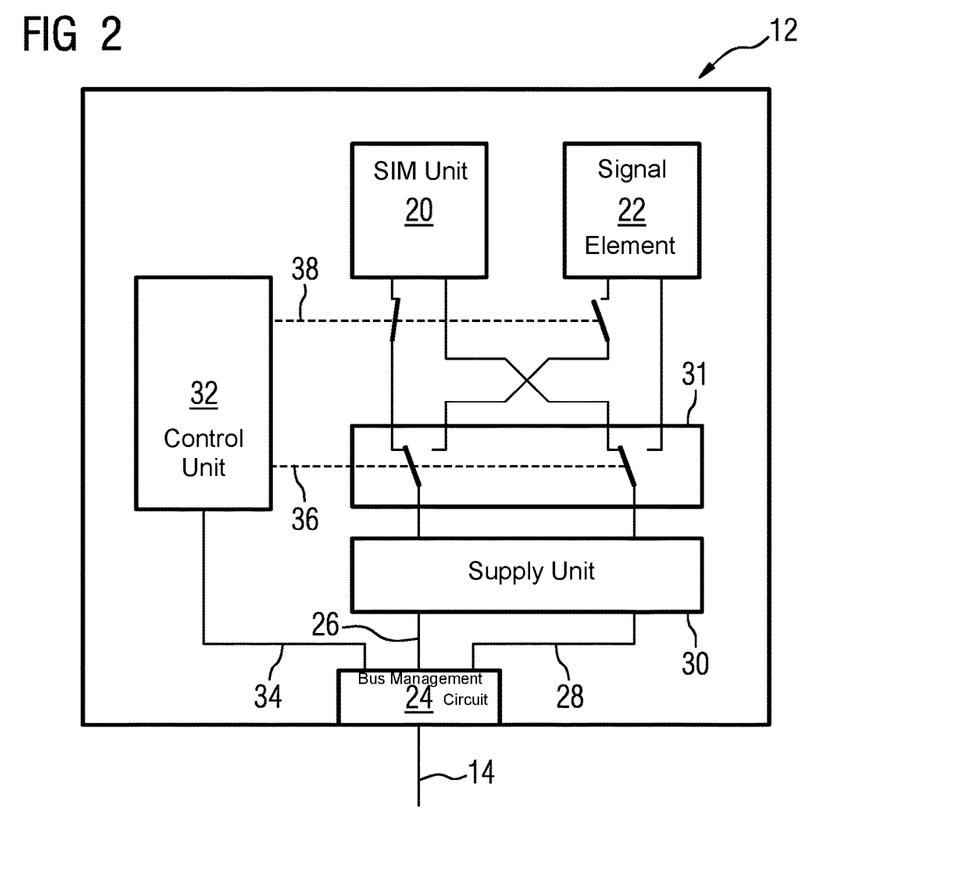
FIG. 2 shows a notification appliance connectable to a bus system and having an activatable simulation unit.

The schematic diagram in FIG. 2 shows an individual notification appliance 12 with further details. According thereto, the notification appliance 12 in accordance with the approach proposed here comprises an activatable energy consumption simulation unit 20 illustrated only schematically in simplified form. The energy consumption simulation unit 20 is sometimes referred to in the following as simulation unit 20 for short.

As well as the simulation unit 20, the notification appliance 12 comprises, in a manner generally known, an activatable signal element 22 likewise illustrated only schematically in simplified form, for example an optical signal element, an acoustic signal element or the like. The notification appliance 12 assumes its notification/signaling function by actuating the respective signal element 22: By actuating the respective signal element 22, i.e. for example by actuating an acoustic signal element, the notification appliance 12 indicates a hazard situation, i.e. for example a fire or smoke generation or the like. An individual signal element 22, i.e. for example an optical signal element, an acoustic signal element or the like, or more than one signal element 22, i.e. for example an optical signal element on the one side and an acoustic signal element or the like on the other side, are referred to in the following individually and collectively as signal element 22 for short.

In some embodiments, the notification appliance 12 is intended and configured to attach the simulation unit 20 to the bus system 14 in place of the signal element 22 incorporated in the notification appliance 12. The simulation unit 20 of a notification appliance is adapted to the signal element 22 incorporated in the notification appliance 12 in such a way that, as described in the introduction, the simulation unit 20 has the same or at least substantially the same properties in electrical terms as the signal element 22 that is to be replaced, for example in that an average energy draw of the simulation unit 20 corresponds or at least substantially corresponds to the average energy draw of the respective signal element 22. This means that the signal element 22 and the simulation unit 20 in a notification appliance 12 have the same or at least substantially the same dependence of their terminal voltage on the current intensity drawn from the bus system 14. In particular on account of the temperature dependence of the losses along the bus system 14, it is not a question of exactly the same properties of simulation unit 20 and signal element 22, and it is rather the case that substantially the same properties are sufficient. In this sense, an energy draw of the simulation unit 20 in the region of +/−5% or +/−10% of the energy draw of the signal element 22 counts as substantially the same energy draw as that of the signal element 22.

To illustrate the alternative attachment either of the signal element 22 or of the simulation unit 20 to the bus system 14, the schematic diagram in FIG. 2 shows a bus attachment circuit 24 incorporated in the notification appliance 12. At least two bus lines 26, 28 incorporated in the bus system 14 and not shown in the bus system 14 lead out from said bus attachment circuit 24. The energy supply to the signal element 22 is provided via said bus lines 26, 28. For this purpose, the notification appliance 12 comprises a supply unit 30, for example. The supply unit 30 comprises for example a capacitor from which an optical signal element 22 draws the electrical energy required for the activation of a respective illumination means.

For the alternative attachment either of the signal element 22 or of the simulation unit 20 to the bus system 14, the notification appliance 12 comprises a switchover unit 31. By means of the switchover unit 31, and depending on the switch position of switching elements incorporated therein, either the signal element 22 or the simulation unit 20 is connected to the bus lines 26, 28 and consequently is attached to the supply unit 30 or to the bus system 14.

For the subsequent description, it is not particularly a question of whether a notification appliance 12 comprises an independent supply unit 30 or not, or whether, for example, the supply unit 30 is on the one hand part of the respective signal element 22 and on the other hand part of the parallel simulation unit 20. A separate supply unit 30 or a unit combined for example with the switchover unit 31 to form a functional unit and supply unit has the advantage of a reduced component requirement since redundant electrical components that can be used equally for supplying the signal element 22 as well as for supplying a simulation unit 20 electrically replacing the signal element 22 during a test are only required once and are combined in the supply unit 30.

In the case of a supply unit 30, an active signal element 22 or an active simulation unit 20 is connected to the bus system 14/attached to the bus system 14 indirectly, namely via the supply unit 30. When reference is made here and in the following to an attachment to the bus system 14, this is to be implicitly interpreted in each case as a direct attachment or an indirect attachment via a supply unit 30 incorporated in the respective notification appliance 12.

The switchover unit 31 is actuated by means of a control unit 32 incorporated in the notification appliance 12. The control unit 32 and the switchover unit 31 may, as shown, be independent functional units, but alternatively may also be implemented as a unit, such that in the latter case the control unit 32 incorporates the switchover unit 31. The description is continued—albeit expressly without any renunciation of a more extensive generality—on the basis of the configuration shown by way of example. According thereto, the control unit 32 actuates the switchover unit 31. This is effected as a function of a signal or telegram which the control unit 32 receives in a manner generally known per se via a further bus line 34 incorporated in the bus system 14 and not shown in the bus system 14 (or via at least one of the already mentioned bus lines 26, 28). In response to such a signal or telegram, the control unit 32 generates a switchover signal 36, which causes a change in the switch position in the switchover unit 31. This is shown in a schematically simplified representation and merely for illustration purposes in the form of an actuation, initiated by means of the switchover signal 36, of two switching elements incorporated in the switchover unit 31. A switchover of the switch position of the switchover unit 31 causes the simulation unit 20 to be attached to the bus system 14 in place of a signal element 22 that was previously attached to the bus system 14 and that as a result of the switchover is attached to the bus system 14, or vice versa.

When the simulation unit 20 is attached to the bus system 14, the signal element 22 incorporated in the notification appliance 12 is electrically inactive and also cannot be activated in a fault situation. Accordingly, when the simulation unit 20 is attached to the bus system 14, no acoustic or optical signal can therefore be output, even if the control unit 32 outputs an activation signal 38 due to a fault situation (fire, smoke generation or the like).

In a switch position of the switchover unit 31 which, as shown, causes the simulation unit 20 to be attached to the bus system 14 in place of the signal element 22, an activation signal 38 output by the control unit 32 results in the electrical circuit comprising the bus system 14 being closed via the simulation unit 20. A portion of the current delivered via the bus system 14 then flows via the simulation unit 20 and the voltage delivered by the bus system 14 is applied across the simulation unit 20. The simulation unit 20 therefore manifests itself as an electrical load on the bus system 14. The energy supply to the individual notification appliances 12 via the bus system 14 can now be checked in the hazard notification system 10 without acoustic and/or optical signals being emitted which could cause concern to users of a building.

In this case, the simulation unit 20 is matched in the above-described manner in each notification appliance 12 to the electrical properties of the respective signal element 22 and optionally is also matched to parameterizable electrical properties of the respective signal element 22.

An example of a parameterizable electrical property is a parameterized volume of an acoustic signal element 22, for example a siren. In such a signal element 22, the parameterizable volume is set by means of a variable resistance. A corresponding parameterization of a simulation unit 20, i.e. a simulation unit which, during the load test, replaces the acoustic signal element 22 having a parameterizable volume, is realized for example by setting an adjustable resistance incorporated in the simulation unit 20. The respective effective magnitude of the resistance is produced in such a simulation unit 20 for example by means of a pulse-width-modulated switching of the resistance to the bus system 14. Owing to a parameterization of the simulation unit 20, a corresponding ohmic resistance of the simulation unit 20 then results and for example a corresponding pulse-width-modulated signal, which switches the resistance to the bus system 14 in each case only during active pulses of the signal.

A further example of a parameterizable electrical property is also a parameterized light intensity of an optical signal element 22. Furthermore, a parameterizable electrical property is for example also a parameterized frequency at which an optical or an acoustic signal is emitted. An example of a corresponding parameterizable signal element 22 is a parameterizable strobe light, wherein an LED which draws the electrical energy for a flash of light to be emitted from a previously charged capacitor incorporated in the signal element 22 acts for example as illumination means. The parameterization of such a signal element 22 then refers to the flash frequency and/or the intensity of the emitted flash of light. Both depend on the charge condition of the capacitor, i.e. on the charge condition at the time at which its electrical energy is switched to the illumination means. A simulation unit 20 replacing such a signal element 22 during the load test likewise comprises a capacitor (or uses the capacitor of a common supply unit 30) and, instead of an LED, a dummy load, in particular a constant current load. The capacitor of the simulation unit 20 is charged to the same or substantially the same charge condition as the capacitor of the signal element 22 would be charged, such that the average energy consumption of the simulation unit 20 during the charging of the capacitor corresponds, or at least substantially corresponds, to the average energy consumption of the signal element 22 during the charging of the capacitor disposed therein. In the case of a capacitor of a supply unit 30 used jointly by the signal element 22 and by the simulation unit 20, the same capacitor is charged both for the signal element 22 and for the simulation unit 20 and, during the charging, the average energy consumption of the capacitor together with the signal element 22 corresponds to the average energy consumption of the capacitor together with the simulation unit 20.

By means of a simulation unit 20 in each notification appliance 12 connected to the bus system 14, the bus system 14 can undergo electrical testing without alarm signals or the like that are perceptible to users of a building being output.

Figure 3:
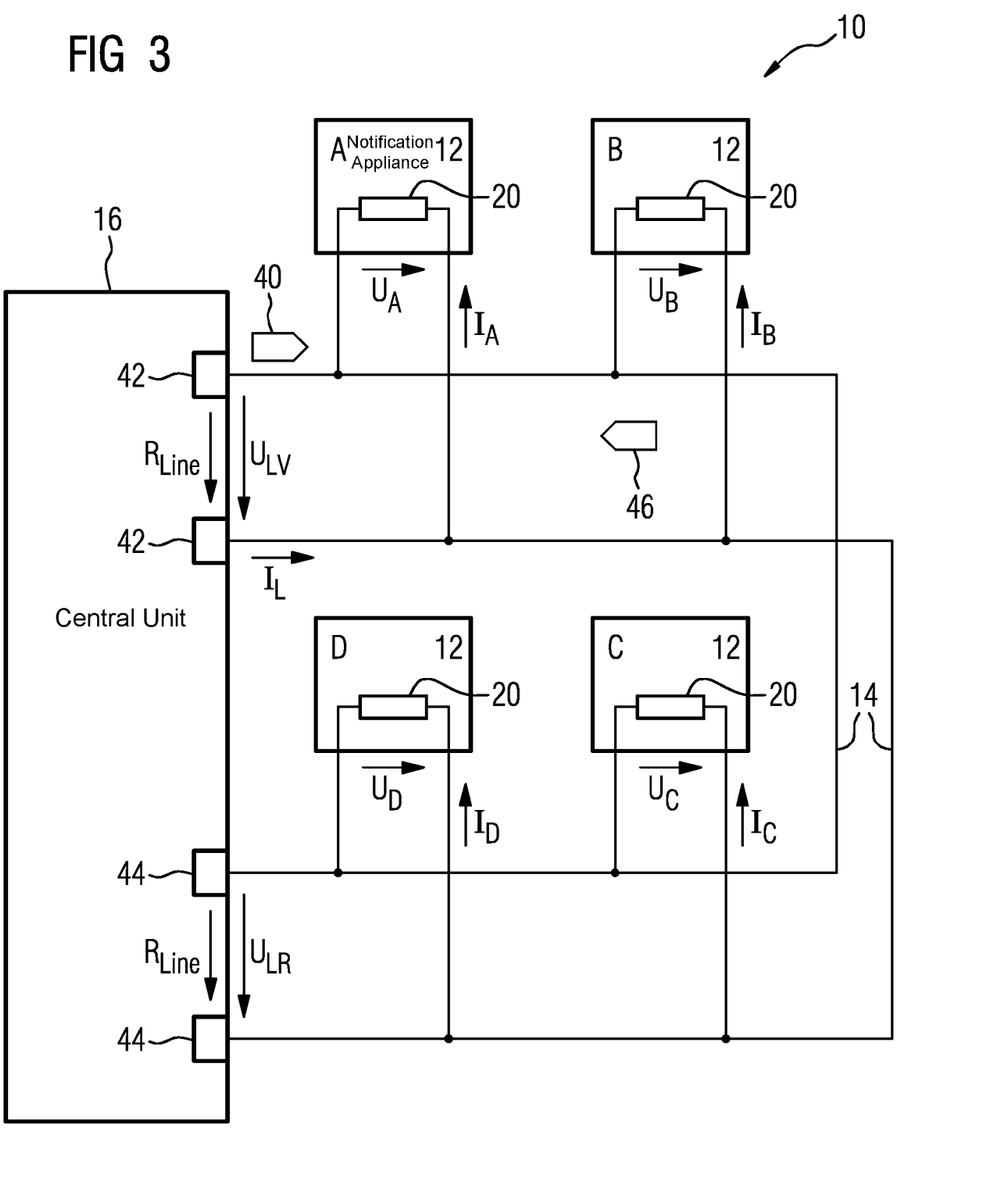
FIG. 3 shows a hazard notification system comprising a plurality of notification appliances connected to a bus system and having activatable simulation units.

Such a test is explained further with reference to the schematic diagram in FIG. 3. This, like the schematic diagram in FIG. 1, shows a number of notification appliances 12 connected to a bus system 14, as well as a central unit 16 from which the bus system 14 originates. Each of the notification appliances 12 connected to the bus system 14 comprises an activatable simulation unit 20 as shown in FIG. 2 and described with reference to FIG. 2. The figure shows the notification appliances 12 in a schematically greatly simplified form and with simulation units 20 attached to the bus system 14.

The bus system 14 is shown by way of example as an annularly closed bus system (ring, loop). In this respect, a start of the bus system 14 and an end of the bus system 14 are connected to the central unit 16 by means of first and second connection ports 42, 44. In the case of a linear bus topology, the bus system 14 is connected to the central unit 16 on one side only.

For a test (load test) of the type proposed here, the central unit 16 of the bus system 14 sends a signal or telegram initiating the load test via the bus system 14 to each notification appliance 12. Said signal or telegram is referred to below for concision and to distinguish it from the switchover signal 36 generated internally in the notification appliance as a switchover telegram 40. In each notification appliance 12 having an activatable simulation unit 20, the switchover telegram 40 causes the simulation unit 20 (instead of the signal element 22) to be attached to the bus system 14. In this way, a test mode is activated on the bus system 14. The test mode is terminated for example by resending the switchover telegram 40 or by sending a special test mode termination telegram.

After a predefined or predefinable time period after the transmission of the switchover telegram 40 has elapsed, it may be assumed that all notification appliances 12 having an activatable simulation unit 20 have attached their simulation unit 20 to the bus system 14 in place of their signal element 22. The test can then begin. Alternatively to a start of the test as a function of the expiration of a waiting time after the transmission of the switchover telegram 40, each notification appliance 12 having an activatable simulation unit 20 can also send a corresponding signal or telegram to the central unit 16 following the attachment of the simulation unit 20 to the bus system 14. In that case, the test starts after such a signal or telegram has been received from all notification appliances 12 having an activatable simulation unit 20.

During the test, a wide variety of current and voltage measurements are performed alternatively or cumulatively. For example, each notification appliance 12 can measure the current flowing via the simulation unit 20 and/or the voltage applied across the simulation unit 20 and store values encoding the measurement result or the measurement results for later retrieval by the central unit 16. Equally, the central unit 16 can measure the voltage delivered to the bus system 14 and/or the current delivered to the bus system and store values encoding the measurement result or the measurement results. The central unit 16 of the bus system 14 is that functional unit within the overall system—the hazard notification system 10—which initiates the load test, automatically controls and monitors it, and automatically evaluates it, the latter for example by generating an alarm signal and/or a fault message.

In the schematic diagram in FIG. 3, the notification appliances 12 shown there by way of example as connected to the bus system 14 are additionally designated symbolically by "A", "B", "C" and "D". In a real hazard notification system 10, considerably more than the four notification appliances 12 shown purely by way of example are usually connected to the bus system 14. The voltages that can be measured by each notification appliance 12 via its respective simulation unit 20 are indicated with reference to said symbolic designations as $U_A$, $U_B$, $U_C$ and $U_D$. Similarly, the currents that can be measured by each notification appliance 12 via its respective simulation unit 20 are indicated with reference to said symbolic designations as $I_A$, $I_B$, $I_C$ and $I_D$.

By means of generally optional voltage measurements, each notification appliance 12 having an activatable simulation unit 20 attached to the bus system 14 monitors the voltage ($U_A$, $U_B$, $U_C$ and $U_D$) dropping across the simulation unit 20 during the test and stores the minimum value ($U_{Amin}$, $U_{Bmin}$, $U_{Cmin}$ and $U_{Dmin}$) resulting during the test. If said minimum value falls below a predefined or predefinable comparison value, in particular a predefined or predefinable comparison value specific to a notification appliance, the affected notification appliance 12 sends for example a fault telegram 46 indicating the voltage undershoot to the central unit 16. In response to receiving such a telegram 46, the central unit 16 indicates a fault during the test. The test has therefore not been terminated successfully.

Alternatively to an active transmission of such a fault telegram 46 by the notification appliance 12, the central unit 16 polls each notification appliance 12 in connection with the termination of the test for the respective minimum value stored therein and compares this with a predefined or predefinable comparison value, in particular a comparison value specific to a notification appliance or notification appliance type, and in the event of an undershoot indicates a fault during the test. In this case, too, the test has not been terminated successfully. In this respect, the fault telegram 46 shown in the diagram may also be construed as a response telegram to a query by the central unit 16. In this case, the fault telegram 46 does not directly indicate a fault situation, but comprises the respective stored minimum value.

By means of a generally optional current measurement, the central unit 16 monitors the current ($I_L$) delivered to the bus system 14 during the test and compares this with bus driver-specific and/or source-specific limit values. A bus driver-specific limit value specifies for example the maximum current ($I_L$) that can be delivered by a bus driver 50 (FIG. 5). A source-specific limit value specifies for example the maximum current that can be delivered by a current source, for example a battery. If the central unit 16 supports a bus system 14 comprising multiple rings or multiple strings, the currents are preferably added up in each ring or string and the total yielded is used as a basis for the comparison with bus driver-specific and/or source-specific limit values. If an overshoot of at least one limit value occurs, the central unit 16 indicates a fault during the test. The test has therefore not been terminated successfully.

By means of a generally optional voltage measurement, the central unit 16 monitors the voltage (feed voltage) delivered to the bus system 14 during the test, in particular by measuring an input-side voltage ($U_{LV}$) and an output-side voltage ($U_{LR}$) separately. The or each voltage measurement value measured by the central unit 16 in respect of the bus system 14 is compared with a predefined or predefinable comparison value, for example a comparison value resulting from a specification of the respective notification appliance 12. If at least one comparison value is undershot during the test, the central unit 16 indicates a fault during the test. The test has therefore not been terminated successfully.

The current measurement performed by the central unit 16 together with the voltage measurement performed by the central unit 16 may be regarded as a load test. In the course of the load test, a resistance value ($R_{Line}$), referred to below as the line resistance, is determined and a resistance reserve can be estimated on the basis of the determined resistance value. The resistance reserve is a measure for the capability to connect further nodes to the bus system 14, and/or a measure for the capability, for example, to increase the volume or the light intensity of individual nodes.

The central unit 16 carries out the or each test so that a declaration will be possible as a result of the test as to whether the bus system 14 is being operated within the predefined limits. Test results are preferably logged and/or logged and/or stored in order to identify a trend.

Figure 4:
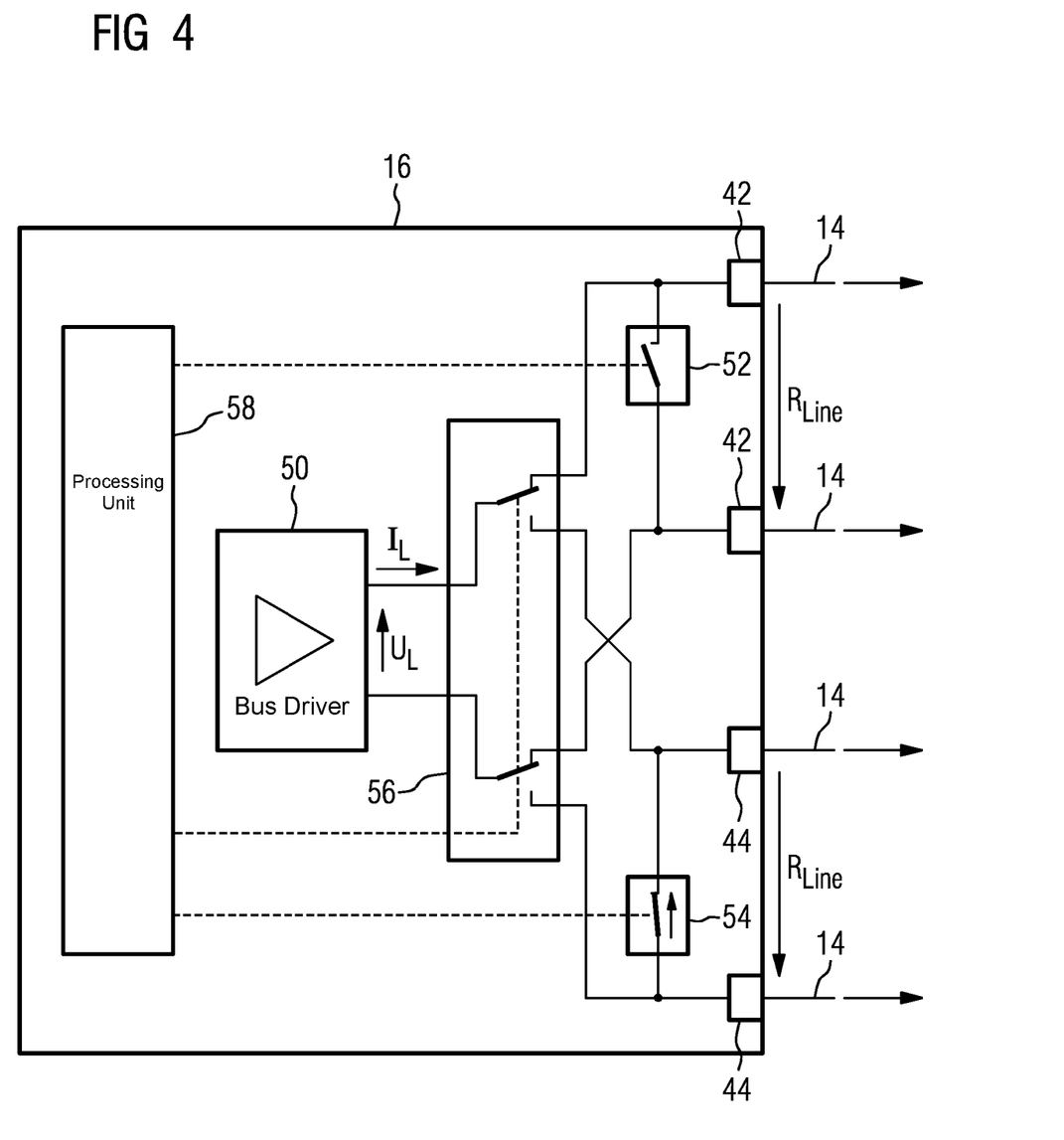
FIG. 4 shows a central unit of a bus system according to FIG. 3.

The schematic diagram in FIG. 4 shows only the central unit 16 of the bus system 14 with further details. According thereto, the central unit 16 comprises a bus driver 50. This outputs the current ($I_L$) that can be carried via the bus system 14 and the voltage ($U_L$) that is available to the bus system 14.

By means of the bus driver 50, the central unit 16 can successively reduce the voltage ($U_L$)—feed voltage—delivered to the bus system 14, in particular for a special embodiment variant of the load test (as mentioned in the introduction to the description).

In a bus system 14 having a ring-shaped topology, as shown, the bus system 14 can optionally be terminated at both ends. For this purpose, the central unit 16 comprises a bus termination switching element 52, 54 assigned to the connection ports 42 and the connection ports 44, respectively. Depending on the switch position of the bus termination switching element 52, 54, the connection ports 42 or the connection ports 44 are connected to one another in an electrically conductive manner. With an activated bus termination switching element 52, 54—as is shown by way of example for the bus termination switching element 54 at the connection ports 44—the bus system 14 ends at the activated bus termination switching element 54.

By means of a bus direction switchover unit 56, it is possible to set whether the current delivered by the bus driver 50 is fed in at the connection ports 42 or at the connection ports 44. The switch position of the bus direction switchover unit 56 and the switch position of the bus termination switching elements 52, 54 are coordinated with one another: At the connection ports 42, 44 at which no current is fed in, the bus termination switching element 52, 54 disposed therein is closed. The direction in which the bus system 14 is operated can be reversed by means of the bus direction switchover unit 56 and the bus termination switching elements 52, 54. In one case, the current delivered by the bus driver 50 is fed in at the connection ports 42. The notification appliances 12 disposed downstream of the connection ports 42 are then supplied with electrical energy in the order of their connection to the bus system 14. In the other case, the current delivered by the bus driver 50 is fed in at the connection ports 44.

The notification appliances 12 disposed downstream of the connection ports 44 are then supplied with electrical energy in the order of their connection. The coordinated actuation of the bus direction switchover unit 56 and the bus termination switching elements 52, 54 is accomplished by means of a processing unit 58 incorporated in the central unit 16, for example a processing unit in the form of a microcontroller or a microprocessor. In addition, the processing unit 58 can fulfill further functions, for example the sending and receiving of telegrams over the bus system 14 and/or the monitoring of the bus configuration, i.e. the monitoring of the number of connected notification appliances 12. Optionally, the processing unit 58 controls and monitors the tests proposed here.

With a bus system 14 in this form that can be switched over in terms of the feed direction, the test described above can be performed in two segments. In a first segment with respect to time, at least one of the above-described tests is performed in this case during an operation of the bus system 14 with a first feed direction (for example a current delivered by the bus driver 50 and being fed in at the connection ports 42). Next, in a second segment with respect to time, at least one of the above-described tests is performed during an operation of the bus system 14 with a second feed direction (for example a current delivered by the bus driver 50 and being fed in at the connection ports 44).

Although the teachings herein have been illustrated and described in more detail on the basis of the exemplary embodiment, the scope of the disclosure is not limited by the disclosed example or the disclosed examples and other variations may be derived herefrom by the person skilled in the art without leaving the scope of protection of the disclosure. Individual prominent aspects of the description filed here may therefore be briefly summarized as follows:

Disclosed are a method for testing a hazard notification system 10 and a notification appliance 12 that is suitable for use in a hazard notification system 10 and that is intended and filed for performing the method and for use within the scope of the method. The method for testing a hazard notification system 10 is a method for testing the hazard notification system 10 during operation and under operational conditions. The method for testing a hazard notification system 10 is a load test of the hazard notification system 10, of the bus system 14 of the hazard notification system 10, and of the notification appliances 12 connected to the bus system 14.

The hazard notification system 10 comprises a plurality of notification appliances 12 connected to a bus system 14. Each notification appliance 12 comprises at least one signal element 22, i.e. for example a signal element 22 for emitting acoustic or optical alarm signals. In addition to the at least one signal element 22, each notification appliance 12 comprises an activatable energy consumption simulation unit 20. The energy consumption simulation unit 20 of a notification appliance 12 has the same or at least substantially the same electrical properties as the or each signal element 22 of the respective notification appliance 12.

In response to receiving a switchover telegram 40, each notification appliance 12 attaches its energy consumption simulation unit 20 to the bus system 14 in place of the or each signal element 22 incorporated in the respective notification appliance 12. Because the energy consumption simulation unit 20 and the or each signal element 22 share the same or at least substantially the same electrical properties, the conditions on the bus system 14 do not change as a result of the attachment of the energy consumption simulation unit 20. Within the scope of the load test, an energy consumption resulting in the bus system 14 and/or specifically in each notification appliance 12 due to the activation of each energy consumption simulation unit 20 is measured and compared with predefined or predefinable comparison values. If necessary, an alarm signal and/or a fault message are/is generated as a function of the result of the comparison.

LIST OF REFERENCE SIGNS

10 Hazard notification system
12 Notification appliance
14 Bus system
16 Central unit
18 (unused)
20 Energy consumption simulation unit, simulation unit
22 Signal element
24 Bus attachment circuit
26 Bus line
28 Bus line
30 Supply unit
31 Switchover unit
32 Control unit
34 (Further) bus line
36 Switchover signal
38 Activation signal
40 Switchover telegram
42 (First) connection port
44 (Second) connection port
46 Fault telegram
48 (unused)
50 Bus driver
52 Bus termination switching element
54 Bus termination switching element
56 Bus direction switchover unit
58 Processing unit

The invention claimed is:

1. A method for operating a hazard notification system including a plurality of notification appliances connected to a bus system, each notification appliance having a signal element and an activatable energy consumption simulation unit, where each notification appliance is configured to select whether the respective signal element or the respective activatable energy consumption simulation unit is connected to the bus system, the method comprising:
receiving a switchover telegram at at least one notification appliance of the plurality of notification appliances;
disconnecting the respective signal element of the at least one notification application from the bus system;
attaching the respective energy consumption simulation unit of each of the at least one notification appliance to the bus system;
measuring an energy consumption resulting in the bus system due to activation of each energy consumption simulation unit;
comparing the measured energy consumption with predefined comparison values; and
generating an alarm signal or a fault message as a function of the result of the comparison.

2. The method as claimed in claim 1, wherein:
a central unit acting as a master unit on the bus system measures the energy consumption resulting in the bus system due to the activation of the respective energy consumption simulation units and compares said measured energy consumption with the predefined comparison values; and the central unit generates the alarm signal or the fault message.

3. The method as claimed in claim 2, wherein: the central unit switches over a feed direction of the bus system during a load test; and performing the load test with a first feed direction prior to the switchover and with a second feed direction opposite to the first feed direction after the switchover.

4. The method as claimed in claim 2, wherein the central unit performs a load test automatically at predefined or predefinable times.

5. The method as claimed in claim 2, wherein the central unit automatically performs a load test when a number of notification appliances connected to the bus system changes.

6. The method as claimed in claim 1, further comprising:
capturing measurement values representing a voltage drop across the respective energy consumption simulation unit of the at least one notification appliance with each of the at least one notification appliance following the activation of the respective energy consumption simulation unit of the at least one notification appliance;
following a load test, polling each of the respective notification units using a central unit acting as a master unit on the bus system for a respective minimum value captured thereby; and
comparing said minimum values with a predefined or predefinable threshold value; and
wherein the central unit generates the alarm signal and/or the fault message as a function of the comparison between the minimum values and the threshold value.

7. The method as claimed in claim 6, further comprising using the central unit to conduct the load test in multiple stages and at each new stage reducing a feed voltage delivered to the bus system.

8. A notification appliance for connecting to a bus system for use in a hazard notification system comprising a plurality of notification appliances connected to a bus system, each notification appliance comprising:
a signal element; an activatable energy consumption simulation unit;
wherein each notification appliance is configured to select whether the respective signal element or the respective activatable energy consumption simulation unit is connected to the bus system,
wherein, in response to receiving a switchover telegram, the respective energy consumption simulation units are automatically attached to the bus system in place of the respective signal elements.

9. A hazard notification system comprising:
a bus system;
a plurality of notification appliances connected to the bus system; and
a central unit acting as a master unit on the bus system, the central unit configured to generate a switchover telegram and submit the switchover telegram to the bus system;
wherein each notification appliance comprises a signal element and an activatable energy consumption simulation unit;
wherein, in response to receiving the switchover telegram at one of the plurality of notification appliances, the one notification appliance of the plurality notification appliances automatically connects the respective energy consumption simulation unit to the bus system and disconnects the respective signal element;

wherein the central unit: measures an energy consumption resulting in the bus system due to activation of the respective energy consumption simulation units, compares the measured energy consumption with predefined comparison values, and generates an alarm signal or a fault message as a function of the comparison.

10. The hazard notification system as claimed in claim 9, wherein a direction in which a current is fed into the bus system can be switched over by means of the central unit and is switched over during a load test.

11. The hazard notification system as claimed in claim 9, wherein, during a multistage load test performed by means of the central unit, a feed voltage delivered to the bus system can be reduced at each new stage of the load test and is reduced during the load test.

* * * * *